United States Patent
Chung

[11] Patent Number: 6,108,210
[45] Date of Patent: Aug. 22, 2000

[54] FLIP CHIP DEVICES WITH FLEXIBLE CONDUCTIVE ADHESIVE

[75] Inventor: Kevin Kwong-Tai Chung, Princeton, N.J.

[73] Assignee: Amerasia International Technology, Inc., Princeton, N.J.

[21] Appl. No.: 09/166,633

[22] Filed: Oct. 5, 1998

Related U.S. Application Data

[60] Provisional application No. 60/082,885, Apr. 24, 1998, and provisional application No. 60/092,147, Jul. 9, 1998.

[51] Int. Cl.[7] .................................................. H05K 7/02
[52] U.S. Cl. ......................... 361/747; 361/748; 361/760; 361/783; 257/736; 257/626; 257/249; 257/737; 257/738; 174/255; 174/256; 174/260
[58] Field of Search .................................... 361/747, 748, 361/760, 764, 777, 783, 820, 765, 766, 776; 257/736, 626, 249, 737, 738, 741, 748, 750, 778, 782, 783, 784, 753, 686; 174/250, 255, 256, 260

[56] References Cited

U.S. PATENT DOCUMENTS

| | | |
|---|---|---|
| 2,774,747 | 12/1956 | Wolfson et al. . |
| 3,401,126 | 9/1968 | Miller et al. . |
| 3,429,040 | 2/1969 | Miller . |
| 4,005,472 | 1/1977 | Marris et al. ............................ 257/737 |
| 4,007,476 | 2/1977 | Hutson ..................................... 257/610 |
| 4,113,981 | 9/1978 | Fujita et al. . |
| 4,404,237 | 9/1983 | Eichelberger et al. .................... 60/525 |
| 4,442,966 | 4/1984 | Jourdain et al. . |
| 4,514,751 | 4/1985 | Bhatacharya ............................ 257/737 |
| 5,048,166 | 9/1991 | Wakamatsu ............................... 29/830 |
| 5,074,947 | 12/1991 | Estes et al. . |
| 5,196,371 | 3/1993 | Kulesza et al. . |
| 5,237,130 | 8/1993 | Kulesza et al. ......................... 174/260 |
| 5,311,401 | 5/1994 | Gates, Jr. et al. ....................... 361/760 |

(List continued on next page.)

OTHER PUBLICATIONS

P. Scharf, T. Coleman and K. Avellar, "Flip Component Technology", IEEE Electronic Component Conference (1967), pp. 269–274.

Gilleo, K: "Direct Chip Interconnect Using Polymer Bonding", IEEE 39th Electronic Component Conference, May 1989, PP37–44.

R. Lachance, H. Lavoie, A Montanari, "Corrosion/Migration Study of Flip Chip Underfill and Ceramic Overcoating", IEEE Electronic Components and Technology Conference (1997), pp. 885–889.

T.Y. Wu, Y. Tsukada, W.T. Chen, "Materials and Mechanics Issues in Flip–Chip Organic Packaging", IEEE Electronic Components and Technology Conference (1996), pp. 524–534.

(List continued on next page.)

Primary Examiner—Leo P. Picard
Assistant Examiner—David Foster
Attorney, Agent, or Firm—Dann, Dorfman, Herrell and Skillman, P. C.

[57] ABSTRACT

An electronic device includes one or more semiconductor chips interconnected to a next level substrate in a flip chip mode using flexible conductive adhesive having a low modulus of elasticity. The flexible conductive adhesive is applied as conductive bumps on the contact pads of the substrate or on the contact pads of the semiconductor chips and is a flexible thermoplastic or thermosetting resin filled with electrically-conductive particles. Other electronic devices, such as packaged components including resistors, capacitors and the like, are bonded with the same flexible conductive adhesive bump approach as is employed for the semiconductor chips. The contact pads of both the chip and the next level substrate are preferably passivated with a metallic coating, preferably a precious metal, prior to interconnection to inhibit oxidation of the pads. A flexible insulating organic underfill may be used, preferably one having substantially the same low modulus of elasticity as that of the flexible conductive adhesive.

43 Claims, 3 Drawing Sheets

U.S. PATENT DOCUMENTS

| | | | |
|---|---|---|---|
| 5,329,423 | 7/1994 | Scholz | 361/760 |
| 5,366,589 | 11/1994 | Chang | 257/774 |
| 5,386,341 | 1/1995 | Olson et al. . | |
| 5,406,122 | 4/1995 | Wong et al. | 257/753 |
| 5,439,731 | 8/1995 | Li et al. | 428/209 |
| 5,478,973 | 12/1995 | Yoon et al. | 174/260 |
| 5,502,002 | 3/1996 | Wong et al. | 438/605 |
| 5,611,140 | 3/1997 | Kulesza et al. . | |
| 5,667,884 | 9/1997 | Bolger . | |
| 5,879,761 | 3/1999 | Kulesza | 427/555 |
| 5,937,320 | 8/1999 | Andricacos et al. | 438/614 |

OTHER PUBLICATIONS

B. Rösner, J. Liu, Z. Lai, "Flip Chip Bonding Using Isotopically Conductive–Adhesives", Electronic Components and Technology Conference, (1996) pp. 578–581.

D. Gamota, C. Melton, "Advanced Encapsulant Materials Systems for Flip Chip", Advancing Microelectronics (Jul./Aug. 1997) pp. 22–24.

R.W. Johnson, D. Price, D. Maslyk, M. Palmer, S. Wentworth, C. Ellis, "Adhesive Based Flip Chip Technology for Assembly on Polyimide Flex Substrates", IEEE International Conference on Multichip Modules, 1997, pp. 81–86.

L. Schaper, K. Maner, S. Ang, "Reliability of Large Conductive Polymer Flip Chip Assemblies for Multichip Modules (MCMs)", IEEE International Conference on Multichip Modules (1997), pp. 87–91.

Dr. V. Ozguz, R. DeLosReyes, Dr. K. Chung, Dr. J. Licari, "Flexible Conductive Adhesive Bumps for Chip Scale Packaging", The Technical Conference At Chip Scale International, May 1998, pp. 15–19.

K. Chung, V. Ozguz, "Flexible Conductive Adhesive as Solder Replacement in Flip Chip Interconnection", Jul. 1998, pp. 1–14.

"Cost Effective Solutions for Advanced Semiconductor Interconnection and Packaging", AI Technology, Inc., Jul. 1998.

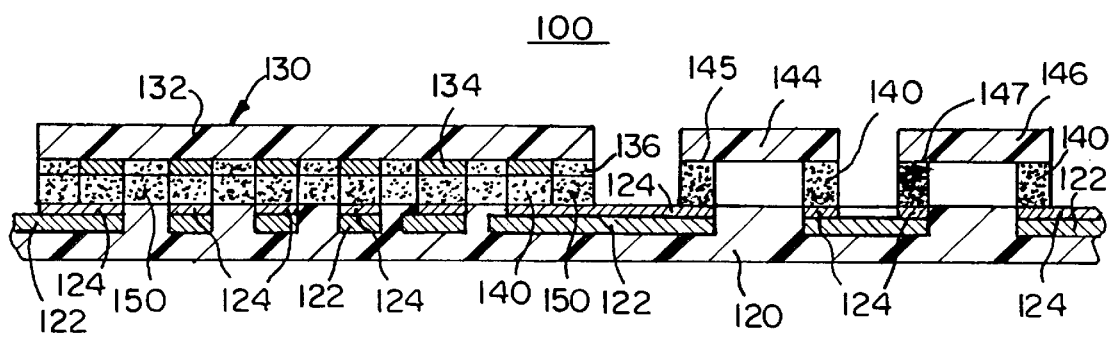
FIG. 6
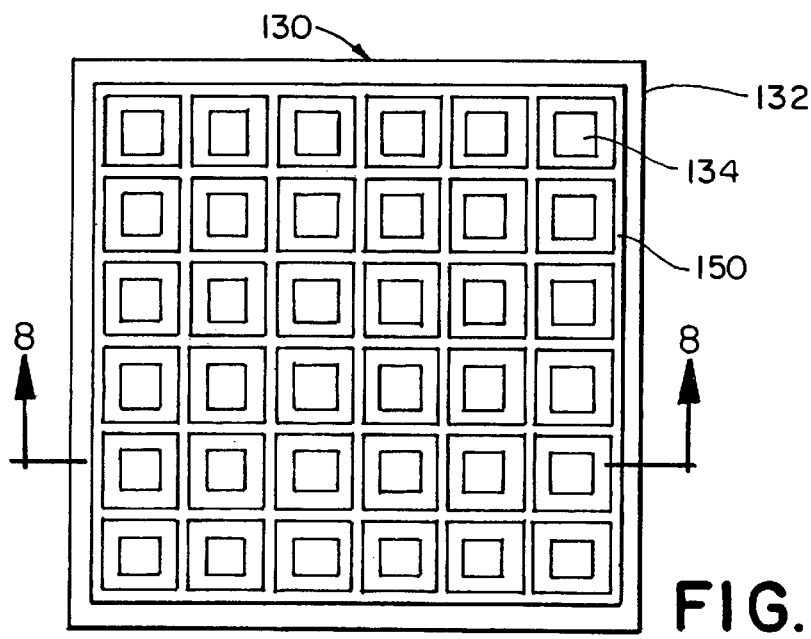
FIG. 7
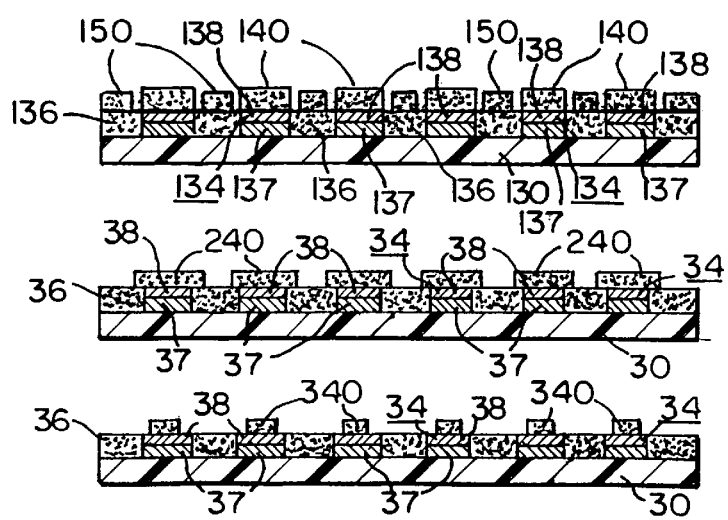
FIG. 8
FIG. 9
FIG. 10

FLIP CHIP DEVICES WITH FLEXIBLE CONDUCTIVE ADHESIVE

This Application claims the benefit of U.S. provisional application Ser. No. 60/082,885 filed Apr. 24, 1998 and of U.S. Provisional application Ser. No. 60/092,147 filed Jul. 9, 1998.

The present invention relates to electronic devices and, in particular, to electronic devices including semiconductor chips adhesively bonded thereon.

Since the invention of integrated circuits in early 1960's, their use has proliferated and they have become indispensable to the multitude of electronic products that modern society has come to rely on and take for granted. While there are many methods of packaging circuits and other semiconductor chips into functional form, their usefulness is greatly enhanced if the physical size of such packaged electronic devices is small and the cost of such packaged devices is low.

Traditionally, connections to semiconductors are made with fine gold or aluminum bond wires that loop from contact pads arranged around the periphery of the top surface of the semiconductor chip (i.e. the side of the chip on which the electronic circuit has been formed) to a lead-frame, header or other package or substrate to which the bottom surface of the semiconductor chip is attached. The technology of bond wire interconnection has been perfected to such a degree that the cost of each bond wire connection is less than one cent ($0.01 US). The electrical characteristics of thin bond wires looping even over a relatively short distance necessarily introduce unwanted inductance and capacitance into the interconnection and thus reduce the bandwidth and operating rate of the electronic devices. This limitation has become more significant in recent years as a result of the development of much faster microprocessors and higher frequency signal processing and communication devices.

One way to reduce the capacitance and inductance of these interconnections is to shorten the length of the interconnection path. One effective conventional way to accomplish this is by flipping the semiconductor chip over (thus, the appellation "flip chip") so that the contact pads are immediately adjacent to the substrate built on which are formed a corresponding set of contact pads to which the contact pads of the semiconductor may be joined directly. U.S. Pat. No. 3,429,040 entitled "Method of Joining a Component to a Substrate" issued to L. F. Miller describes a flip chip arrangement in which the semiconductor chip is attached to the substrate by solder bumps. The distance between the flip chip and the substrate has been reduced to about 50–100 microns and thereby to enable operation at dramatically higher frequencies.

The interconnection of semiconductor devices in flip chip configuration has evolved from the use of very elaborate metallization and metallurgy to form a conductive bump of suitable height to which connection may be made, to the use of a less demanding and inexpensive solder bump. Soldering and solder-bump technology and metallurgy may be changed in known manner to accommodate changes in composition and methods of depositions suitable for lower and higher temperature reflow soldering of such interconnections. The inherent limitation of solder bump technology has become apparent when semiconductor devices are sought to be directly attached to an organic substrate due to the differences in the coefficient of thermal expansion (CTE) of the materials. For example, FR-4 fiberglass substrates have a CTE of 17 ppm/° C. whereas the semiconductor chip has a CTE of 3 ppm/° C. Substantial limitations similarly arise when the size of the semiconductor chip is greater than five millimeters (5 mm) on each edge, even when the flip chip interconnection is made to an alumina substrate which has a CTE of only 7 ppm/° C. The solder joints have a modulus of elasticity of about 10,000,000 psi and so have very little compliance, thereby rendering the solder connections subject to fatigue failures when subjected to cyclical temperature excursions.

U.S. Pat. No. 4,113,981 entitled "Electrically Conductive Adhesive Connecting Arrays of Conductors" issued to Fujita et al. describes a non-conductive adhesive base that is filled with too few conductive particles to render it conductive, except where it may be compressed. Fujita et al. describes using such adhesive to attach raised contacts where normally non-contacting conductive particles in the non-conductive adhesive are pressed against raised contacts of a device so that the raised contacts of the device are in electrical contact with the raised contact pads of the substrate and where isolation between laterally adjacent contacts is maintained by the insulating resin. In a conventional semiconductor wafer, the contact pads, normally formed of aluminum, are recessed below the final insulating inorganic passivation layer. One of the limitations of the Fujita patent is that the contact pads must extend above the top of the insulating passivation layer or substrate. This additional preparation, either as part of the semiconductor wafer fabrication or as a separate process, tends to increase the cost of the semiconductor device and, therefore, the interconnection. Another limitation of the Fujita interconnection is that only a limited number of conductive paths may be formed within each conductive contact, so that electrical isolation between only a few of the conductor particles can render the interconnection non-conductive, and, therefore, useless.

Isotopically conductive adhesives have long been used for bonding the backside of the semiconductor die to a package before the contact pads of the die are wire-bonded to the package leads and have also found extensive use to attach semiconductor components, chip resistors and chip capacitors in hybrid circuit assemblies and in printed wiring board assemblies.

An early usage of conductive adhesive for flip chip bonding is suggested by Scharf et al. in an article entitled "Flip-Component Technology", published in the Proceedings of IEEE Electronic Component Conference, 1967 (pp. 269–275). Therein, conductive adhesive bumps were stenciled onto a substrate having an array of sixteen bond pads for each semiconductor die that was to be bonded. Scharf et al. focus on how to create a better stencil for printing precision bumps and state certain advantages of using conductive adhesive ,such as lower temperature bonding and lower cost. Subsequently, U.S. Pat. No. 4,442,966, entitled "Method of Simultaneously Manufacturing Multiple Electrical Connections Between Two Electrical Elements" issued to P. Jourdain et al. describes the use of conductive paste for bonding aluminum pads on a semiconductor to a substrate in which the stenciling method of depositing the conductive adhesive bumps on the contact padsis employed and in which pressure and heat are applied during assembly of the semiconductor to the substrate.

The uses of such conductive epoxy adhesives for bonding semiconductor chips and the application of such adhesives have been reported in several articles, such as by K. Gilleo in "Direct Chip Interconnect Using Polymer Bonding", 39th Electronic Component Conference, May 1989, (pp.37–44) and U.S. Patents. The limitations of rigid conductive adhesives therein are similar to those of the solder bump approaches, i.e. the connections tend to fracture under temperature cycling. The adhesive joints in the reported applications employ rigid adhesives having a modulus of elasticity of 1,000,000 psi or higher and, as a result, have very little compliance and are subject to delamination or fracture failures over repeated temperature excursions.

Thus, the major problem facing chip to component or chip to board interconnection is the internal stresses arising from the difference between the coefficient of thermal expansion of the silicon of the semiconductor chip and that of the next level board, i.e. the substrate to which the semiconductor chip is attached. Both conventional conductive adhesives and solder-bump technologies are hampered by these high-stress-related failures which are exacerbated by extreme temperature differences and larger chips, as is the trend for modern electronics.

The conventional solution to the stress problem is to seek to spread out the stress using an epoxy underfill in the areas not containing conductive adhesive connections. While proper underfill does in many cases help to increase the number of thermal cycles that such interconnections can survive by a factor of 6–8, depending on semiconductor die size and the temperature excursions, the inherent problem of balancing the beneficial compressive stress of the high-strength underfill that limits the cycling strain achieved against the devastating shear stress that will delaminate or break the joints or parts remains. Every increase in the dimension of the semiconductor die increases the shear stress, and thus the reliability of the assembled flip chip under thermal cycling must be re-evaluated for each particular range of temperatures. Similarly, when the extreme of a temperature excursion is extended to lower or higher temperature, additional shear stress can adversely affect the reliability of the assembled flip chip, also necessitating expensive re-evaluation testing. While suitable high-modulus of elasticity underfills can help to increase the ability of the flip chip device assembly to withstand thermal excursion stresses, nevertheless it is limited in terms of both the size of semiconductor device that can be utilized and the differential between the thermal expansion coefficient of expansion of the semiconductor chip and that of the next level substrate. In addition, the cost of incorporating such rigid adhesive underfill is relatively high and the high-strength adhesive underfill also makes repair and rework much more difficult (if possible at all), thereby further adding to the cost of devices incorporating multiple flip chips.

Another possible solution to this technological problem is to engineer the next level board, i.e. the substrate, to have the same coefficient of thermal expansion as that of the semiconductor chip, e.g., about 3 ppm/° C. While this technical approach has been successfully utilized by some, it is not used extensively because of the undesirable higher cost to both develop and manufacture such a substrate and to create the infrastructure necessary to support such new technology. Even more vexing is the fact that the lowest cost common electronic substrate is a fiberglass laminate with epoxy resin, such as FR-4, which is commonly used in printed wiring circuit boards and which has a CTE of 17 ppm/° C. Conventional commercial electronic equipment almost universally employs FR-4 printed circuit boards. Thus, either an extra intermediate substrate would be required, at added cost, or a specialized substrate material to replace FR-4 would be required.

Accordingly, there is a need for an interconnection technology for both chip-scale-packaging and direct-chip attachment on a functional circuit board that will accommodate the differences in the coefficients of thermal expansion between the silicon of the semiconductor chip and that of the next level board.

To this end, the present invention comprises a semiconductor chip having contact pads thereon passivated by a precious metal, wherein the semiconductor chip is connected in a flip chip manner to a substrate having corresponding contact pads thereon passivated by a precious metal. Connections between corresponding contact pads on the semiconductor chip and on the substrate are made with a flexible conductive adhesive having a low modulus of elasticity.

BRIEF DESCRIPTION OF THE DRAWING

The detailed description of the preferred embodiments of the present invention will be more easily and better understood when read in conjunction with the FIGURES of the Drawing which include:

FIG. 6 is a cross-sectional diagram of an alternative embodiment of an electronic device including a flip chip semiconductor device according to the present invention;

FIG. 7 is a plan view of the semiconductor device employed in the embodiment of FIG. 6;

FIG. 8 is a cross-sectional view of the semiconductor device of FIG. 7 after the application of flexible conductive adhesive, and flexible underfill; and FIGS. 9 and 10 are cross-sectional views of alternative embodiments of the semiconductor device shown in FIGS. 4 and 7 after application of flexible conductive adhesive.

DESCRIPTION OF THE PREFERRED EMBODIMENTS

It should be understood that the particular embodiments of the invention described herein are shown by way of illustration and example, and not as limitations of the invention, the principles and features of which may be employed in various embodiments without departing from the scope and spirit of the invention.

In general, the present invention relates to electronic devices wherein the interconnections between a substrate and electronic components mounted thereon, such as flip chip devices including semiconductor devices, resistors, capacitors and other components, a formed of a flexible conductive adhesive that has a low modulus of elasticity so as to exhibit substantial compliance to accommodate differences between the coefficients of thermal expansion (CTE) of the electronic components and the substrate of up to 60 ppm/° C. without the need of high modulus underfills to prevent fatigue and delamination failures. If an optional underfill is to be employed, as may be desirable to enhance the electrical isolation and to reduce migration of certain metals employed as conductors, such underfill must also be flexible having a low modulus of elasticity, preferably one the same as or lower than that of the flexible conductive adhesive interconnections.

Figure 1:
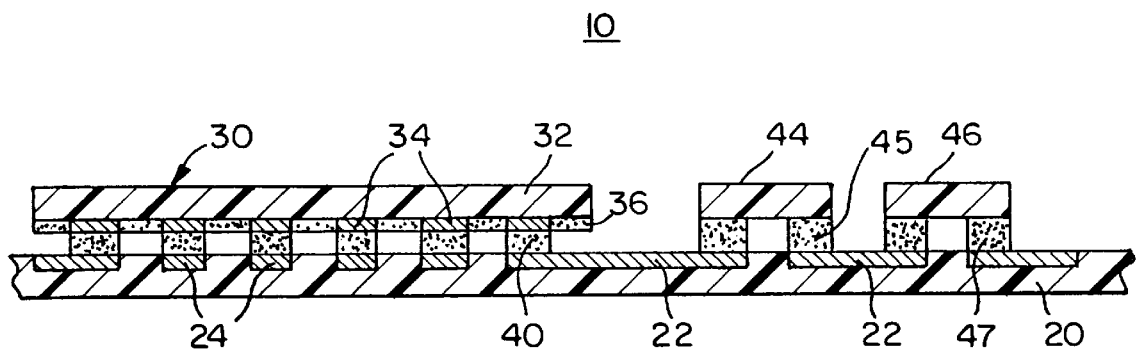
FIG. 1 is a cross-sectional diagram of an embodiment of an electronic device including a flip chip semiconductor device according to the present invention.

Electronic device 10 of FIG. 1 includes an insulating substrate 20 on which are aligned and mounted a plurality of electronic devices, such as semiconductor chip 30, chip resistor 44 and chip capacitor 46. There is no insulating underfill between the devices 30, 44, 46 and substrate 20 in this embodiment. Semiconductor chip 30 includes on a first surface of substrate die 32 a plurality of contact pads 34 for making electrical connections between the electronic circuit contained in the semiconductor chip 30 and external electronic elements. Similarly, resistor 44 and capacitor 46 each include on a respective first surface a plurality of contact pads for making electrical connections between the resistive and capacitive circuit elements respectively contained in chip resistor 44 and in chip capacitor 46 and external electronic elements via substrate 20.

Substrate 20 includes on a first surface thereof printed wiring conductors 22 that form the conductors of an electronic circuit in conventional manner. A plurality of contact pads 24 are formed on the conductors 22 of substrate 20 at locations that correspond to the locations of corresponding bonding pads 34, 45, 47 of the electronic devices 30, 44, 46, respectively, to be mounted thereon. In other words, the arrangement, size and spacing of the contact pads 24 of substrate 20 match the arrangement, size and spacing of the contact pads 34 of semiconductor device 30. Substrate 20 may be fabricated of laminates such as FR-4 fiberglass or BT material, of coated aluminum, or of alumina, ceramic or other suitable insulating material and the conductors 22 thereon may be formed of metals, such as copper, aluminum, gold or silver, or by conductive inks formed by known technologies, such as by thin-film or thick-film deposition. If the contact pads thereon are not of a non-oxidizing material, such as a precious metal, then the contacts should be passivated with a precious metal coating or alloy for consistent long-term stability and integrity of electrical contact, as is also the case for the device attached to the substrate.

Electronic devices 30, 44, 46 are positioned with their respective first surfaces proximate the first surface of substrate 20 so that the respective contact pads of electronic devices 30, 44, 46 are adjacent the respective corresponding contact pads 24 on substrate 20, i.e. in a flip chip manner. Electronic devices 30, 44, 46 are attached to substrate 20 by a plurality of flexible conductive adhesive bumps 40 that provide the mechanical attachment of the respective device 30, 44, 46 to substrate 20 as well as provide a low impedance electrical connection between each respective contact pad 34, 45, 46 and its counterpart correspondingly located on substrate 20, typically 0.1 ohm or less.

Figure 2:
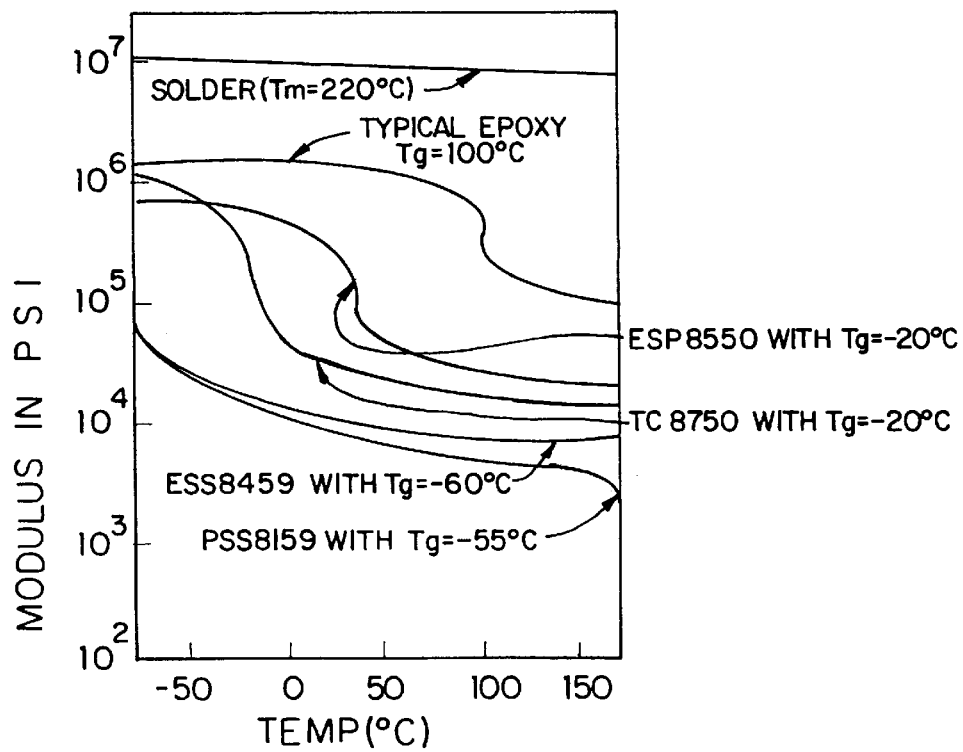
FIG. 2 is a graphical representation of the modulus of elasticity of various adhesives as a function of temperature.

It is necessary that the conductive adhesive 40 be "flexible" by which is meant that it has a low modulus of elasticity. Conductive adhesives having a modulus of elasticity of less than about 500,000 psi as a filled composite are necessary. The adhesive, which may include a thermoplastic or a thermosetting resin, or a blend or copolymer thereof, is rendered conductive by the inclusion of small particles of conductive material therein, which also increase its modulus of elasticity over that as a neat resin. Suitable flexible conductive adhesives include type LTP8150 liquid flexible-thermoplastic conductive adhesive, types ESS8450 (silver filler), ESS8456 (silver-palladium alloy filler), ESS8457 (gold-plated copper filler), ESS8458 (gold powder filler) and ESS8459 (gold-plated nickel filler) flexible epoxy-based adhesive pastes and types PSS8156 (silver-palladium alloy filler), PSS8157 (gold-plated copper filler), PSS8158 (gold powder filler) and PSS8159 (gold-plated nickel filler) flexible paste adhesives, all of which are commercially available from AI Technology, Inc. of Princeton, N.J. These flexible conductive adhesives have glass transition temperatures of about −55° C. to −60° C. and so have a modulus of elasticity of about 500,000 psi at low temperature, as is shown in FIG. 2. Type PSS8150 flexible conductive adhesive includes thermoplastic resins having a glass transition temperature below −20° C. and having more than 30% elongation of dimension before fracture. Type ESS8450 flexible conductive adhesive includes modified thermosetting epoxy resins having a glass transition temperature below 0° C. and having more than 30% elongation of linear dimension before fracture. Thermoplastic resins having a melt flowable temperature below 300° C. are preferred.

In FIG. 2 are shown graphical representations of the modulus of elasticity (in psi) as a function of temperature (in ° C.) for various conductive adhesives. Conventional adhesives, such as solder and epoxy exhibit modulii of elasticity exceeding about 1,000,000 psi over most of the temperature range over which semiconductor devices are typically operated. A typical operating temperature range specified for semiconductor devices is −55 to +150° C. for devices intended for demanding applications such as automotive, aerospace and military applications, and devices intended for less demanding applications such as in home entertainment and appliance applications, may have a lesser temperature range specified.

Flexible conductive adhesives to be employed in the present invention exhibit modulii of elasticity of about 500,000 psi or less over at least about 50% of the operating temperature range over which semiconductor devices are specified to operate. Preferred adhesives exhibit modulii of elasticity of less than about 100,000 psi over such temperature range, as is exhibited by type ESS8459, and even less than about 50,000 psi, as is exhibited by type PSS8159, both of which conductive adhesives have glass transition temperatures of about −55 to −60° C.

Suitable conductive fillers for the flexible conductive adhesive include silver, gold, palladium, or platinum particles (flakes, spheres or powder) silver-palladium alloy particles, and gold-plated copper or nickel particles, as are included in various ones of the aforementioned flexible conductive adhesives available from AI Technology, Inc. The silver-palladium alloy powder fillers were most resistant to silver migration when the proportion of palladium is at least in the range of about 10–30%; although higher percentages of palladium provide greater resistance to silver migration, the fillers may become too costly for many applications. Other alloys of precious metals are also suitable. Flexible conductive adhesive connections according to the present invention can exhibit contact resistance of 0.1 ohm or less.

Further, one preferred flexible conductive adhesive includes a conductive filler including gold-plated and palladium-plated copper flakes. Another preferred flexible conductive adhesive includes a conductive filler including gold-plated and palladium-plated nickel flakes. Other non-precious metals such as aluminum, and other non-precious metal alloy cores may also be used effectively with precious metal plating. The choice of core material and plating material may be made based on cost and ease of plating. Another flexible conductive adhesive is made with specifically prepared silver particulate to exhibit a volume electrical resistivity of less than 0.00009 ohm-cm thereby to allow a higher current to flow through a particular interconnection, or, in other words, to allow higher current densities in the interconnections. It is noted that the conductive fillers are not limited to those specifically mentioned above, but the filler particles must be at least passivated to resist oxidation by a coating or plating of precious metal where the core of the particle is not made of a precious metal.

For gold-, palladium-, and platinum-coated metal flakes and powders, the precious metal coating should be more than about 5% by weight to provide stability against long term high temperature oxidation, such as can occur when the precious metal coating is excessively thin, that will slowly cause degradation of the bulk electrical resistivity characteristic of the filler. When the precious metal coating exceeds about 50% of the total weight of the filler, the cost effectiveness of using coated metals is lost. A gold content in the range from about 5% to 30% by weight is effective for satisfactory electrical performance and cost effectiveness.

Therefore, the foregoing is a low-cost flexible conductive adhesive interconnection that because it has a low modulus of elasticity will flex and not be vulnerable to the stresses induced by the inherent CTE difference between substrate 20 and substrate 32. Exemplars of the foregoing electronic device including semiconductor devices of 12 mm by 12 mm, without underfill, showed no measurable degradation in bond strength and contact resistance after 1000 cycles over the temperature range of −55° C. to +150° C. and after more than 50 cycles of thermal shock between −65° C. and +150° C. with a 10 minute dwell time at each temperature and with 10 second transitions between temperatures. The superiority of the foregoing electronic device employing a flexible conductive adhesive to interconnect semiconductor chips to a substrate can be readily appreciated by comparison with published thermal cycling data. Recently published studies by Rosner et al., "Flip Chip Bonding Using Isotropic Conductive Adhesives", *Proceedings of Electronic Component and Technology Conference,* May, 1996 (pp.578–581), Wu et. al., "Materials and Mechanics Issues in Flip-Chip Organic Packaging", *Electronic Components and Technology Conference,* May, 1996 (pp. 524–534) and Gamota et.al., "Advanced Encapsulant Material Systems for Flip Chip", *Advancing Microelectronics,* July/August, 1997 (pp. 22–24), reported on the reliability and improvements of contact resistance as a function of thermal cycling for solder-bump attachment and rigid conductive adhesive attachment. Samples of both the solder-bump and rigid conductive adhesive interconnections, without underfill, failed within 100 cycles when subjected to temperature cycling over the moderate range of −25° C. to +125° C.

Figure 3:
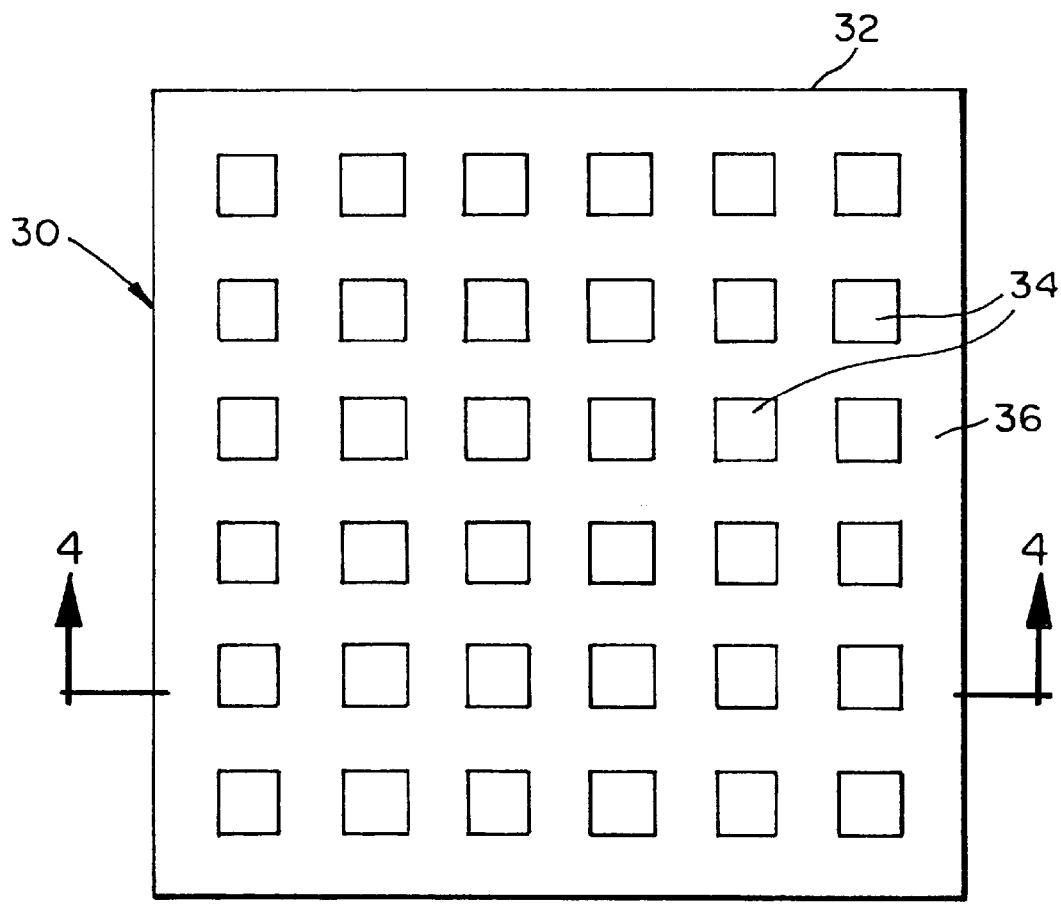
FIG. 3 is a plan view of the semiconductor device employed in the embodiment of FIG. 1.
Figure 4:
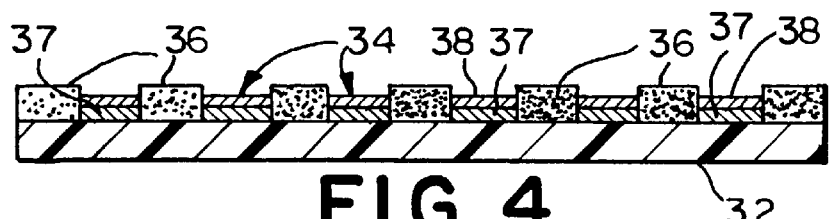
FIGS. 4 and 5 are cross-sectional views of the semiconductor device of FIG. 3 before and after the application of flexible conductive adhesive, respectively.
Figure 5:
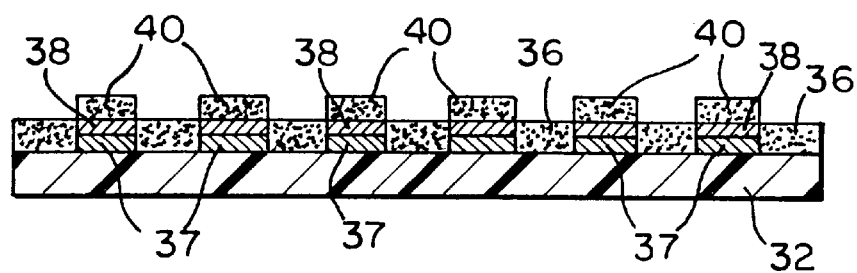

One method of constructing electronic devices of the sort shown and described in relation to FIG. 1 above may be understood in relation to FIGS. 3, 4 and 5. In FIG. 3, semiconductor substrate 32 in plan view includes a plurality of contact pads or bonding pads 34 on the top surface thereof. Contact pads 34 may be around the periphery of substrate 32, or in the interior of substrate 32, or both as illustrated, as may be convenient to the designers of the semiconductor device 30. Areas of substrate 32 that do not contain contact pads 34 are passivated with inorganic nitride, such as silicon nitride, or other insulating coating 36, and will not receive flexible conductive adhesive. Bumps of flexible conductive adhesive 40 will be applied over each of the plurality of contact pads 34 as described below. For ease of handling and lower cost, it is preferred that the bumps of flexible conductive adhesive be applied at the wafer level to all of the substrates 32 formed thereon before the wafer is scored and the individual substrate dies separated, although the adhesive could be applied to individual substrates 32, if desired.

FIG. 4 is a cross-sectional view of the semiconductor device of FIG. 3 taken at the section line 4—4 therein. Contact pads 34 comprise aluminum pads 37 deposited on the semiconductor substrate 32 at the locations to which electrical contact is to be made for electrical function of the circuit (not shown) formed thereon, and aluminum pads 37 are passivated by a deposited metal layer 38 of a non-oxidizing metal, preferably a sequence of nickel and gold or other precious metal, such as gold, silver, platinum, palladium, or an alloy thereof. Nickel and chromium may also be employed as a non-oxidizing passivation. The contact pads 24 of substrate 20 are also passivated with a non-oxidizing metal. As is normal in semiconductor fabrication, but is not necessary, the thickness of the inorganic passivation coating 36 is greater than the thickness of the contact pads 34.

In FIG. 5, a plurality of flexible conductive adhesive bumps 40 are deposited on the plurality of contact pads 34. Flexible conductive adhesive bumps 40 are deposited and built up of a flexible thermoplastic conductive adhesive, such as liquid thermoplastic conductive adhesive LTP8150, sold commercially by AI Technology, Inc., on the nickel-gold passivation layer 38 of contact pads 34. The ratio of resin to silver filler is preferably between approximately 100:100 and 100:600 to produce a volume resistivity as deposited of about 0.00015 ohm-cm. The viscosity of the admixture of liquid thermoplastic adhesive with silver flakes is adjusted with an ester alcohol solvent, such as is sold commercially by Eastman Kodak Chemicals under the trade name Texanol, to approximately 200,000 cp as measured at 0.5 rpm of cone-and-plate using viscosity measurement apparatus available commercially from Brookfield Company of Stoughton, Mass.

Flexible conductive adhesive to form bumps 40 may be deposited using a standard stainless-steel stencil or screen where the bump dimension is 75 microns or larger, or by ink-jet printing, contact deposition, preform lamination, or other suitable means of deposition. The bump may be circular or rectangular in shape. While the size and shape of the bump are not critical for most applications, it is preferred that the dimension (diameter) of bump 40 be at least as large as the dimension (diameter) of contact pad 34 so as to exhibit the lowest possible contact resistance when assembled into the final device 10. The liquid thermoplastic paste is allowed to dry at 60–80° C. for 30 to 60 minutes for deposits having a wet thickness of 75 to 125 microns. The resulting height of the adhesive bump 40 when dry is typically 50–60% of the wet thickness and the bumps will typically be uniform in diameter to a precision approaching 98% and in bump height to a precision approaching 90%. The height of the dried bumps is typically 50–100 microns. The flexible conductive adhesive bumps 40 are preferably deposited when the semiconductor chip 30 is in wafer form after the aluminum bond pads 37 have been passivated with nickel-gold layer 38 to prevent oxidation. The wafer with the dry conductive bumps 40 thereon can be further exposed to 200° C. for 1–5 seconds to improve the adhesion of the adhesive bumps 40 to the contact pads 34. The prepared wafer may then be diced into individual substrate dies which may be stored at ambient temperature before subsequent assembly into an electronic device.

The prepared semiconductor device 30 with bumps of flexible conductive adhesive thereon as shown in FIG. 5 is assembled onto the next level board, i.e. substrate 20, to form the electronic device 10 as shown in FIG. 1 as follows. Semiconductor device 30 is aligned over substrate 20 so that the respective contact pads 24, 34 of substrate 20 and semiconductor device 30 are aligned. Device 30 and substrate 20 are pressed together and flexible adhesive bumps 40 bond the respective contact pads together instantly if the temperature is in the range of 195–215° C. and the placement pressure is about 10 psi. For better efficiency, the substrate 20 is preheated to a temperature of about 150–200° C. while the chuck picking up semiconductor chip 30 is preheated to about 220–280° C. Electronic devices 10 assembled as thus described that included semiconductor dies 30 having edge dimensions of over 10 mm bonded onto an alumina substrate 20 have been shown to withstand more than 1000 thermal cycles between −65° C. and 150° C. and more than 50 thermal shocks between −65° C. and +150° C. without a measurable change in contact resistance. Exposure to 85° C. at 85% relative humidity (RH) for 168 hours also produced no measurable degradation in electrical contact resistance, and exposure to 100° C. at 100% RH for 200 hours also showed no measurable degradation in the shear adhesion strength of the die 30 to the substrate 20. Both thick-film and thin-film gold bond pads on the alumina substrate have proven to be satisfactory.

It is noted that the tools and temperatures employed in the method of assembly described above are compatible with those used for traditional placement and attachment of flip-chip devices having solder bumps by reflow soldering. In both cases the contact pads of the flip-chip device are aligned with the corresponding contact pads of the substrate and are then pressed together at a temperature of less than 300° C. and pressure of less than 10 psi, and the bonding is achieved within about 10 seconds.

While the foregoing embodiment described in relation to FIGS. 1–5 did not require and did not employ an underfill, in certain applications it may be desirable that an underfill with suitable flow characteristics be employed. An underfill is an insulative adhesive material placed in the spaces between the conductive interconnections between the mounted device, such as a flip-chip device, and a substrate. In order to preserve the mechanical flexibility and low internal stress that characterize the interconnection bonding according to the present invention, suitable underfill materials are non-conductive flexible adhesives that have substantially the same or lower modulus of elasticity as that of the flexible conductive adhesive employed for the conductive interconnections between the semiconductor device and the substrate, i.e. less than about 500,000 psi.

Electronic device 100 of FIG. 6 includes an insulating substrate 120 on which are aligned and mounted a plurality of electronic devices, such as semiconductor chip 130, chip resistor 144 and chip capacitor 146. Semiconductor chip 130 includes on a first surface of substrate 132 a plurality of contact pads 134 for making electrical connections between the electronic circuit contained in the semiconductor chip 130 and external electronic elements. Similarly, resistor 144 and capacitor 146 each include on a respective first surface a plurality of contact pads for making electrical connections between the resistive and capacitive circuit elements respectively contained in chip resistor 144 and in chip capacitor 146 and external electronic elements via substrate 120.

Substrate 120 includes on a first surface thereof printed wiring conductors 122 that form the conductors of an electronic circuit in conventional manner. A plurality of contact pads 124 are formed on the conductors 122 of substrate 120 at locations that correspond to the locations of corresponding bonding pads 134, 145, 147 of the electronic devices 130, 144, 146, respectively, to be mounted thereon. In other words, the arrangement, size and spacing of the contact pads 124 of substrate 120 match the arrangement, size and spacing of the contact pads 134 of semiconductor device 130. Substrate 120 may be fabricated of laminates such as FR-4 fiberglass or BT material, or of alumina, ceramic or other suitable insulating material and the conductors 122 thereon may be formed of metals, such as copper, aluminum, gold or silver, or by conductive inks formed by known technologies, such as by thin-film or thick-film deposition. If the contact pads thereon are not of a non-oxidizing material, such as a precious metal, then the contacts should be passivated with a precious metal coating or alloy for consistent long-term stability and integrity of electrical contact, as is also the case for the device attached to the substrate.

Electronic devices 130, 144, 146 are positioned with their respective first surfaces proximate the first surface of substrate 120 so that the respective contact pads of electronic devices 130, 144, 146 are adjacent the respective corresponding contact pads 124 on substrate 120. Electronic devices 130, 144, 146 are attached to substrate 120 by a plurality of flexible conductive adhesive bumps 140 that provide the mechanical attachment of the respective device 130, 144, 146 to substrate 120 as well as provide a low impedance electrical connection between each respective contact pad 134, 145, 146 and its counterpart correspondingly located on substrate 120. Insulating flexible underfill 150 substantially fills the interstices or spaces between the devices 130, 144, 146 and substrate 120 not occupied by flexible conductive adhesive 140 in the embodiment of FIG. 5.

It is necessary that the conductive adhesive 140 as well as the insulating adhesive 150 both be "flexible" by which is meant that each has a modulus of elasticity of less than about 500,000 psi. Suitable flexible conductive adhesives which are commercially available from AI Technology, Inc. of Princeton, N.J., are identified above in relation to the embodiment of FIG. 1. The non-conductive or insulating resin, which may be a thermoplastic or a thermosetting resin, may be selected from flexible underfill or encapsulant materials, such as the MEE7650-5 epoxy-based encapsulant material also available from AI Technology, Inc., which material has a modulus of elasticity of less than 15,000 psi and a glass transition temperature of less than −20° C. In addition to increasing the strength of the bond between components 130, 144, 146 and substrate 120, this flexible insulting underfill also helps to prevent silver migration between the contact pads of components 130, 144, 146 or of substrate 120, as might occur under a high humidity condition.

One method of constructing electronic devices of the sort shown and described in relation to FIG. 6 may be understood in relation to FIGS. 7 and 8. In FIG. 7, semiconductor substrate 132 in plan view includes a plurality of contact pads or bonding pads 134 on the top surface thereof. Areas of substrate 132 that do not contain contact pads 134 are passivated with inorganic nitride, such as silicon nitride, or other insulating coating, and will receive the flexible non-conductive adhesive 150. Bumps of flexible conductive adhesive 140 are applied over each of the plurality of contact pads 134 and a pattern of insulating flexible adhesive 150 is applied in the spaces between the flexible conductive adhesive bumps as described below. For ease of handling and lower cost, it is preferred that the bumps of flexible conductive adhesive 140 and the pattern of non-conductive flexible adhesive 150 be applied at the wafer level to all of the substratedies 132 formed thereon before the wafer is scored and the individual substrate dies separated, although the adhesive could be applied to individual substrates 132, if desired. It is further preferred that insulating flexible adhesive 150 not completely fill the spaces between contact pads 34 to allow for the flexible adhesives 140, 150 to flow and fill voids during bonding of semiconductor device 130 to substrate 120.

FIG. 8 is a cross-sectional view of the semiconductor device 130 of FIG. 7 taken at the section line 8—8 therein. Contact pads 134 comprise aluminum pads 137 deposited on the semiconductor substrate 132 at the locations to which electrical contact is to be made for electrical function of the circuit (not shown) formed thereon. Aluminum pads 137 are passivated by a deposited metal layer 138 of a non-oxidizing metal, preferably a sequence of nickel and gold or nickel and palladium layers, or another precious metal, such as gold, silver, platinum, palladium, or an alloy thereof. In the exemplary embodiment of FIG. 8, the thickness of the inorganic passivation coating 136 is substantially the same as the thickness of the contact pads 134.

A plurality of flexible conductive adhesive bumps 140 are deposited on the plurality of contact pads 134. Flexible conductive adhesive bumps 140 are deposited and built up of a flexible thermoplastic conductive adhesive, such as liquid thermoplastic conductive adhesive LTP8150, sold commercially by AI Technology, Inc., on the nickel-gold passivation layer 138 of contact pads 134, as described above in relation to the embodiment of FIG. 1. Again, while the size and shape of the bump are not critical for most applications, it is preferred that the size of bump 140 be at least as large as the contact pad 134 so as to exhibit the lowest possible contact resistance when assembled into the final device 100.

Similarly, the insulating flexible adhesive 150 may be patterned to fill the spaces between bumps 140 or may preferably be patterned to not completely fill such spaces so as to allow for flow of both flexible conductive adhesive 140 and flexible insulating adhesive 150 when semiconductor device 130 is assembled with substrate 120. The flexible conductive adhesive bumps 140 and the patterns of flexible insulating adhesive 150 are preferably deposited when the semiconductor chip 30 is in wafer form after the aluminum bond pads 137 have been passivated with nickel and gold layers 38 or other precious metal to prevent oxidation. The prepared wafer may then be diced into individual substrate dies which may be stored at ambient temperature before subsequent assembly into an electronic device. The deposition of flexible conductive adhesive to form bumps 140, as well as the deposition of a pattern of flexible insulating adhesive 150, may be performed using a standard stainless-steel stencil or screen, or by ink-jet printing, contact deposition, preform lamination or other suitable means of deposition.

The flexible insulating adhesive employed as the underfill are those that, like the preferred flexible conductive adhesives, may be stored at ambient temperature for extended periods of time after deposition and drying and before final assembly bonding. Examples of suitable materials are liquid thermoplastic paste type LTP7150 and liquid epoxy type LESP7450 available from AI Technology, Inc. LTP7150 is a thermoplastic paste that can be deposited and B-staged to form a solid film by curing at 60–80° C. for 30–60 minutes. LESP7450 is an epoxy paste that can be deposited and B-staged to form a solid film by curing at 60–80° C. for 30–60 minutes. These modified B-stageable flexible adhesives has in its neat resin form a molecular structure such that the overall glass transition temperature is below −55° C. Both of the B-staged flexible insulating adhesives have a higher flow index and a lower modulus of elasticity than those of the flexible conductive adhesive bumps. This furthers protection at the edges of a device when the insulating adhesive flows and fills the spaces near the edge of the device. Mechanical testing under highly-accelerated moisture and temperature exposure showed less than 20% change in bond strength and no delamination of the bonds. Thermal cycling from −65° C. to 150° C. for 2000 cycles of electronic devices assembled using these adhesives for bonding a large silicon semiconductor die (16 mm edge dimension) to an aluminum substrate that has a CTE of more than 20 ppm/° C. also produced no delamination of the bonds and no measurable reduction of the bond strength.

The prepared semiconductor device 130 with bumps of flexible conductive adhesive 140 and a pattern of insulating flexible adhesive 150 thereon as shown in FIG. 8 is assembled onto the next level board, i.e. substrate 120, to form the electronic device 100 as shown in FIG. 6 as follows. Semiconductor device 130 is aligned over substrate 120 so that the respective contact pads 124, 134 of substrate 120 and semiconductor device 130 are aligned. Device 130 and substrate 120 are pressed together and flexible adhesive bumps 140 bond the respective contact pads 124, 134 together instantly if the temperature is in the range of 195–215° C. and the placement pressure is about 10 psi. In like manner, the insulating flexible adhesive 150 bonds the areas between contact pads 124 of substrate 120 to the corresponding areas between contact pads 134 of semiconductive device 130. For better efficiency, the substrate 120 is preheated to a temperature of about 150–200° C. while the chuck picking up semiconductor chip 130 is preheated to about 220–280° C. Electronic devices 100 assembled as thus described that included semiconductor dies 130 having edge dimensions of over 10 mm bonded onto an alumina substrate 120 have been shown to withstand more than 1000 thermal cycles between −65 and +150° C. and more than 50 thermal shocks between −65° C. and +150° C. without a measurable change in contact resistance. Exposure to 85° C. at 85% relative humidity (RH) for 168 hours also produced no measurable degradation in electrical contact resistance, and exposure to 100° C. at 100% RH for 200 hours also showed no measurable degradation in the shear adhesion strength of the die 130 to the substrate 120. Both thick-film and thin-film gold bond pads on the alumina substrate have proven to be satisfactory.

The assembly process is similar where a flexible epoxy adhesive is employed. The placement chuck is maintained at a lower temperature of 150–175° C. and the die to be placed onto the next level board substrate is allowed to cure for an additional five minutes at 150–175° C. without pressure or other tooling before it is assembled. When thermoplastic-based flexible adhesives are employed, the temperature of the placement chuck (and of the die it holds) and of the substrate must be maintained a few degrees above the temperature at which the flexible adhesive conductive bumps and insulating adhesive underfill, if any, are rendered flowable.

In most the applications, the contact pads 34 and the adhesive bumps 40 may be of the same size. In some cases, however, because of the relatively small number of contact pads, the overall area of bonding may be relatively small and so it may be advantageous to have the conductive bumps substantially enlarged in relation to the area of the contact pads while maintaining the pitch (i.e. the center-to-center spacing between adjacent contact pads ) of the contact pads. Such increase in the area of the flexible conductive bumps will increase the mechanical strength of the bond between semiconductor device 30 and substrate 20, as well as lowering the overall electrical resistance and increasing the current carrying capability of the flexible conductive interconnections.

Where the aggregate area of the contact pads 34 is substantially less than about 33% of the total area of semiconductor device 30, the bonding area may be insufficient to provide adequate bond strength without reinforcement. In the embodiment of FIG. 9, the flexible conductive adhesive bumps 240 on semiconductor device 30 are intentionally enlarged so as to cover substantially more than the areas of the individual bond pads 34. Where enlarged conductive adhesive bumps 240 can be employed while maintaining the recommended minimum spacing between closest pads of more than 50 microns, the "overhang" of the conductive bumps 240 may increase the aggregate bonding area to more than about 50% and thus increase the bonding integrity using only the flexible conductive adhesive without need for an underfill layer.

On the other hand, when the number of contact pads 34 is large and the pitch of the contact pads is small, it may be desirable to substantially reduce the area of the flexible conductive bumps while maintaining the pitch. This reduction of the area of the conductive bumps helps to reduce the likelihood of bridging between adjacent interconnections during the bonding process. The reduction of the area of the flexible interconnections is particularly useful where an insulating underfill is not employed.

For example, when contact pads 34 are closer together than about 100 microns, conductive bumps 340 with areas less than that of the contact pads 34 may be employed. In FIG. 10, conductive bumps 340 are substantially smaller in area than are the bond pads 34 of semiconductor device 30. This approach is more suitable for low-current-density interconnections and where higher interconnection resistance can be tolerated by the electronic circuits of which substrate 20 and semiconductor device 30 form a part.

While the present invention has been described in terms of the foregoing exemplary embodiments, variations within the scope and spirit of the present invention as defined by the claims following will be apparent to those skilled in the art. For example, the substrate 20 circuit board material may be different from ceramic alumina which has a CTE of 7 ppm/° C. In fact, most commercial applications employ FR-4, BT and other organic substrate materials that have a much higher CTE so that the degree of CTE mismatch between silicon flip chips which have a CTE of 3 ppm/° C. and the substrate increases from the 7 ppm/° C. CTE of alumina to the 17 ppm/° C. CTE of FR-4. With higher CTE mismatches, e.g. those greater than 10 ppm/° C., thermal cycling and shock are more likely to cause failures due to delamination or fracture of the interconnections. In electronic devices 10 according to the present invention assembled using flexible conductive adhesives types LTP8150 and ESS8450 available from AI Technology, Inc., including silicon devices having an edge dimension as large as 16 mm bonded to aluminum substrates so as to have 3 vs 25 ppm/° C. CTE mismatches, thermal cycling from −65° C. to 150° C. for over 2000 cycles produced no detectable delamination or change in bond strength. Similar testing was performed on electronic devices employing a FR-4 substrate and no delamination or change in bond strength was found.

In addition, other flexible conductive adhesive materials with the same or similar molecular flexibility, adhesion and conductivity as that of type LTP8150 of AI Technology, as well as flexible adhesives employing other conductive fillers, may be substituted therefor. Suitable alternative deposition means, such as stenciling, screening, masking, ink-jet printing, contact deposition, preform laminating, needle dispensing and others, may be used to deposit conductive adhesive bumps 40, 140, 240 onto the contact pads of the semiconductor device 30 or other electronic component 44, 46, or alternatively, to deposit conductive adhesive bumps 40, 140, 240 onto the contact pads of the substrate 20.

While the exemplary embodiments described above have both the flexible conductive adhesive bumps and the flexible insulating adhesive pattern deposited onto the semiconductor die, it is noted that the flexible conductive adhesive bumps and the flexible insulating adhesive pattern may be deposited on the substrate. Alternatively, the pattern of flexible insulating adhesive may be deposited on one of the semiconductor device or the substrate, and the flexible conductive adhesive bumps may be deposited upon the other one thereof. Further, the flexible insulating adhesive may be loaded with thermally conductive but insulating fillers. Some suitable such adhesives include types LESP7455, LESP7555, LTP7555 and LTP7095 which are available from AI Technology, Inc.

While the above exemplary embodiments show a single flip-chip attachment, it should be apparent that multiple semiconductor chips may be mounted on the same device substrate using the methods described herein. It should also be noted that both bare (i.e. uncoated) flip chip semiconductor devices and other electronic components, as well as packaged semiconductor devices and electronic components, may be attached onto the same circuit substrate employing the conductive bumps and method herein described.

What is claimed is:

1. An electronic device comprising a semiconductor chip having contact pads thereon passivated by a precious metal, wherein said semiconductor chip is connected in a flip chip manner to a substrate having corresponding contact pads thereon passivated by a precious metal, wherein connections between corresponding contact pads on said semiconductor chip and on said substrate are made with a flexible conductive adhesive having a low modulus of elasticity.

2. The electronic device of claim 1 wherein said flexible conductive adhesive is deposited onto the contact pads of one of said semiconductor chip and said substrate, wherein the deposited flexible conductive adhesive on at least some of said contact pads has an area that is substantially greater than the area of said contact pads while maintaining pitch between said contact pads.

3. The electronic device of claim 1 wherein said flexible conductive adhesive is deposited onto the contact pads of one of said semiconductor chip and said substrate, wherein the deposited flexible conductive adhesive on at least some of said contact pads has an area that is substantially smaller than the area of said contact pads while maintaining pitch between said contact pads.

4. The electronic device of claim 1 wherein the flexible conductive adhesive includes a polymer having a modulus of elasticity of less than 100,000 psi.

5. The electronic device of claim 4 wherein the modulus of elasticity is maintained over more than 50% of the range of temperature over which said electronic device is specified to operate.

6. The electronic device of claim 1 wherein the flexible conductive adhesive includes a polymer having a modulus of elasticity of less than 50,000 psi.

7. The electronic device of claim 6 wherein the modulus of elasticity is maintained over more than 50% of the range of temperature over which said electronic device is specified to operate.

8. The electronic device of claim 1 wherein the flexible conductive adhesive includes an organic resin selected from the group including thermoplastics having a melt flowable temperature below 300° C., cross-linkable thermosets, and blends and copolymers thereof, wherein a substantial portion of the molecular structure of the organic resin has a glass transition temperature of below 0° C. as a neat resin.

9. The electronic device of claim 1 wherein the flexible conductive adhesive connections between the contact pads on said semiconductor chip and the corresponding contact pads on said substrate have a contact resistance of less than 0.1 ohm.

10. The electronic device of claim 1 wherein the flexible conductive adhesive includes conductive particles that are substantially smaller than the any of the contact pads of said semiconductor chip and of said substrate, and wherein said conductive particles include a metal selected from the group including silver, gold, palladium, platinum, and alloys thereof.

11. The electronic device of claim 10 wherein said alloy thereof is a silver-palladium alloy having at least 10% palladium by weight.

12. The electronic device of claim 11 wherein said alloy thereof includes no less than 5% by weight of one of gold and palladium.

13. The electronic device of claim 1 wherein areas of said semiconductor chip that are not connected to said substrate with said flexible conductive adhesive are filled, at least in part, with a flexible insulating adhesive having a modulus of elasticity that is no greater than the modulus of elasticity of said flexible conductive adhesive.

14. The electronic device of claim 13 wherein the modulus of elasticity of said flexible insulating adhesive is less than 100,000 psi.

15. The electronic device of claim 1 wherein said substrate is formed of an organic material having a coefficient of thermal expansion of no less than 10 ppm/° C. along any axis thereof.

16. The electronic device of claim 1 wherein said precious metal passivation of the contact pads is an alloy of the precious metal.

17. An electronic circuit assembly comprising a plurality of electronic components including at least one semiconductor chip and at least one of a resistor and a capicitor, and a substrate having contact pads passivated by a precious metal to which said electronic components are mounted, wherein said semiconductor chip has contact pads passivated with a precious metal, wherein said electronic components including said semiconductor chip are connected in a flip chip manner to corresponding contact pads on said substrate, and wherein connections between corresponding contact pads of said electronic components including said semiconductor chip and of said substrate include a flexible conductive adhesive having a low modulus of elasticity.

18. The electronic circuit assembly of claim 17 wherein said flexible conductive adhesive is deposited onto the contact pads of one of said plurality of electronic components and said substrate, wherein the deposited flexible conductive adhesive on at least some of said contact pads has an area that is substantially greater than the area of said contact pads while maintaining pitch between said contact pads.

19. The electronic circuit assembly of claim 18 wherein said flexible conductive adhesive is deposited onto the contact pads of one of said plurality of electronic components and said substrate, wherein the deposited flexible conductive adhesive on at least some of said contact pads has an area that is substantially smaller than the area of said contact pads while maintaining pitch between said contact pads.

20. The electronic circuit assembly of claim 18 wherein the flexible conductive adhesive includes a polymer having a modulus of elasticity of less than 500,000 psi.

21. The electronic circuit assembly of claim 20 wherein the modulus of elasticity is maintained over more than 50% of the range of temperature over which said electronic device is specified to operate.

22. The electronic circuit assembly of claim 21 wherein the flexible conductive adhesive includes a polymer having a modulus of elasticity of less than 100,000 psi.

23. The electronic circuit assembly of claim 22 wherein the modulus of elasticity is maintained over more than 50% of the range of temperature over which said electronic device is specified to operate.

24. The electronic circuit assembly of claim 23 wherein the flexible conductive adhesive includes a polymer having a modulus of elasticity of less than 50,000 psi.

25. The electronic circuit assembly of claim 24 wherein the modulus of elasticity is maintained over more than 50% of the range of temperature over which said electronic device is specified to operate.

26. The electronic circuit assembly of claim 18 wherein the flexible conductive adhesive includes an organic resin selected from the group including thermoplastics having a melt flowable temperature below 300° C., cross-linkable thermosets, and blends and copolymers thereof, wherein a substantial portion of the molecular structure of the organic resin has a glass transition temperature of below 0° C. as a neat resin.

27. The electronic circuit assembly of claim 18 wherein the flexible conductive adhesive connections between the contact pads on said electronic components and the contact pads on said substrate have a contact resistance of less than 0.1 ohm.

28. The electronic circuit assembly of claim 18 wherein the flexible conductive adhesive includes conductive particles that are substantially smaller than the any of the contact pads of said electronic components and of said substrate, and wherein said conductive particles include a metal selected from the group including silver, gold, palladium, platinum, and alloys thereof.

29. The electronic circuit assembly of claim 28 wherein said alloy thereof is a silver-palladium alloy having at least 10% palladium by weight.

30. The electronic circuit assembly of claim 29 wherein said alloy thereof includes no less than 5% by weight of one of gold and palladium.

31. The electronic circuit assembly of claim 18 wherein areas of said semiconductor chip that are not connected to said substrate with said flexible conductive adhesive are filled, at least in part, with a flexible insulating adhesive having a modulus of elasticity that is no greater than the modulus of elasticity of said flexible conductive adhesive.

32. The electronic circuit assembly of claim 31 wherein the modulus of elasticity of said flexible insulating adhesive is less than 100,000 psi.

33. The electronic circuit assembly of claim 18 wherein said substrate is formed of an organic material having a coefficient of thermal expansion of no less than 10 ppm/° C. along any axis thereof.

34. The electronic circuit assembly of claim 18 wherein said precious metal passivation of the contact pads of said electronic components and of said substrate is an alloy of the precious metal.

35. An electronic device comprising:
at least one semiconductor device having a plurality of contact pads on a first surface thereof;

a substrate having a plurality of contact pads on a first surface thereof, wherein said contact pads of said substrate are arranged in a pattern to correspond to the contact pads on said semiconductor device and wherein said semiconductor device and said substrate are positioned with their respective first surfaces proximate each other; and a plurality of flexible conductive adhesive connections between respective ones of the contact pads of said semiconductor device and of the contact pads of said substrate, wherein said flexible conductive adhesive has a modulus of elasticity of less than about 500,000 psi.

36. The electronic device of claim 35 wherein the flexible conductive adhesive has a modulus of elasticity of less than 100,000 psi.

37. The electronic device of claim 36 wherein the modulus of elasticity is maintained over more than 50% of the range of temperature over which said electronic device is specified to operate.

38. The electronic device of claim 37 wherein the flexible conductive adhesive includes an organic resin selected from the group including thermoplastics having a melt flowable temperature below 300° C., cross-linkable thermosets, and blends and copolymers thereof, wherein a substantial portion of the molecular structure of the organic resin has a glass transition temperature of below 0° C. as a neat resin.

39. The electronic device of claim 37 wherein the flexible conductive adhesive connections between the contact pads on said semiconductor device and the corresponding contact pads on said substrate have a contact resistance of less than 0.1 ohm.

40. The electronic device of claim 37 wherein the flexible conductive adhesive includes conductive particles that are substantially smaller than the any of the contact pads of said semiconductor device and of said substrate, and wherein said conductive particles include a metal selected from the group including silver, gold, palladium, platinum, and alloys thereof.

41. The electronic device of claim 40 wherein said alloy thereof is a silver-palladium alloy having at least 10% palladium by weight.

42. The electronic device of claim 40 wherein said alloy thereof includes no less than 5% by weight of one of gold and palladium.

43. The electronic device of claim 37 wherein areas of said semiconductor device that are not connected to said substrate with said flexible conductive adhesive are filled, at least in part, with a flexible insulating adhesive having a modulus of elasticity of less than 100,000 psi.

* * * * *